United States Patent [19]

Biggers

[11] 4,099,266
[45] Jul. 4, 1978

[54] SINGLE-CHIP BI-POLAR SENSE AMPLIFIER FOR A DATA PROCESSING SYSTEM USING MOS MEMORY

[75] Inventor: Clifford Biggers, Miltitas, Calif.

[73] Assignee: Data General Corporation, Westboro, Mass.

[21] Appl. No.: 772,164

[22] Filed: Feb. 25, 1977

[51] Int. Cl.$^2$ .............................................. G11C 7/06
[52] U.S. Cl. .................................. 365/208; 307/270; 307/DIG. 3
[58] Field of Search ............ 340/173 R; 307/DIG. 3, 307/270

[56] References Cited

U.S. PATENT DOCUMENTS

| 3,648,071 | 3/1972 | Mrazek | 307/DIG. 3 |
| 4,056,740 | 11/1977 | Schoeff | 307/DIG. 3 |

OTHER PUBLICATIONS

Remshardt et al., A High Performance Low Power 2048-Bit Memory Chip in MOSFET Technology and its Application, IEEE Journay of Solid–State Circuits, vol. SC–11, No. 3, Jun. 1976, pp. 352–359.

*Primary Examiner*—Stuart N. Hecker
*Attorney, Agent, or Firm*—Joel Wall; Jacob Frank

[57] ABSTRACT

A single-chip memory-sense amplifier for a data processing system. There is disclosed a sense amplifier (level converter) and bus driver for use in a data processing system, to receive signal inputs from main memory and to drive a memory bus connecting output of the sense amplifier to the CPU. This sense amplifier is intended for use with memory fabricated from N-channel MOS technology. The circuitry of the sense amplifier is fabricated from bi-polar technology and formed on a single monolithic integrated circuit chip. The biasing scheme employed within the circuitry of the sense amplifier provides reliable operation, by making the amplifier relatively insensitive to power supply variations.

5 Claims, 4 Drawing Figures

SINGLE-CHIP BI-POLAR SENSE AMPLIFIER FOR A DATA PROCESSING SYSTEM USING MOS MEMORY

CROSS REFERENCE TO RELATED APPLICATIONS

The present application is related to the subject matters disclosed in the following patent applications: U.S. Ser. No. 665,478, filed Mar. 10, 1976, now U.S. Pat. No. 4,016,551, entitled "Dynamic MOS Memory With Reduced Propagation Delay"; U.S. Ser. No. 662,180, filed Feb. 27, 1976, now U.S. Pat. No. 4,048,673, entitled "CPU-I/O Bus Interface For A Data Processing System"; U.S. Ser. No. 662,177, filed Feb. 27, 1976, now U.S. Pat. No. 4,047,201, entitled "I/O Bus Transceiver For A DataProcessing System"; and, U.S. Ser. No. 662,179, filed Feb. 27, 1976, now U.S. Pat. No. 4,040,032, entitled "Peripheral Device Controller For A Data Processing System". The present application and the foregoing related applications are assigned to common assignee, Data General Corporation, and the subject matters disclosed in these related applications are incorporated herein by reference.

BACKGROUND OF THE INVENTION

1. Field of the Invention

The present invention generally relates to a data processing system, and more particularly relates to a bi-polar integrated circuit semiconductor chip forming a memory-sense amplifier and memory-bus driver.

2. Description of Prior Art

The prior art includes examples of integrated circuit construction of computer memories, amplifiers, and central processing units (CPU's). The technologies that are employed for these constructions include MOS (metal oxide semiconductor) and bi-polar technologies. For example, semiconductor memories such as those termed random access memories (RAMs), read only memories (ROMs), and programmable read only memories (PROMs), if constructed from MOS technology, may each be fabricated on a single silicon substrate.

In semiconductor MOS, memory cells are either static or dynamic. The static type of cell generally includes bi-stable circuits such as flip-flops which once set in a particular state remain in that state without periodic re-energization or "refreshing". But, static circuits require a relatively large number of devices, for example, several field effect transistors are required to make a flip-flop. By comparison the dynamic memory cells typically employ capacitor storage and thus require fewer devices to store a bit of information, but since such storage is transient, refreshing of the information stored on the inherent capacitance is required periodically.

The size of a memory array which may be fabricated on a semiconductor chip is limited by the number of electrical connections made to a given size LSI (large scale integrated circuit) chip, and the quantity of semiconductor devices formed on the chip. In accordance with known probability factors effecting LSI fabrication techniques, production yield of LSI chips is inversely related to the area of the chip, which determines the number of semiconductor devices on the chip, so that an increase in the chip size and consequently the number of semiconductors thereon would tend to decrease its production yield. Therefore, with the given size LSI chip, increases in the size of a memory array on the chip can be most practically achieved by decreasing the number of semiconductor devices required to store a binary digit, for example, by using capacitive storage memory cells which require fewer semiconductor devices than the more conventional bi-polar or flip-flop memory cell. The main memory of the present invention is thus constructed from MOS, or capacitively refreshed memory cells, to obtain the reduced area/increased yield advantages, and others as well.

Having chosen MOS fabrication for the memories of the data processing system in which the present invention is employed, a discussion of the background of sense-amplifiers is now in order. Sense amplifiers as referred to in combination with MOS memory structure fall into two basic categories. The first category is memory cell state sensing, as exemplified by two prior art patents: U.S. Pat. Nos. 3,967,252 and 4,003,034.

The second category is memory state level conversion, (also known to those skilled in the art as "sensing", which may tend to cause some ambiguity). One technique presently used in this second category is conversion from MOS voltage levels to higher Bi-polar voltage levels using some of the MOS circuitry of the very chip for which the levels are being converted; this technique requires external buffering, as, for example, by a TTL buffer, in order to drive memory busses. Another technique presently used in this second category is level conversion from MOS levels to bi-polar levels external of the MOS chip, this other technique being related to operation of the present invention.

More specifically, the first technique for level shifting is a common design approach which had been used and which is presently still employed, and which is to fabricate on a single chip, an MOS memory chip and an MOS level converter. The level conversion is needed in order to make the MOS voltage levels compatible with higher TTL or bi-polar voltage levels, the TTL circuitry being employed normally in bus driver circuits, since more current is available with TTL than with MOS. One of the shortcomings of this first technique, however, is that relatively large propagation delays are inherently associated with level shifting as accomplished by MOS technology, due, at least in part, to the inherent capacitance involved.

As noted above, Applicant's invention operates with the other level conversion technique, and which thus enables a solution to this time propagation shortcoming by not requiring level shifting with MOS circuitry. Instead, the MOS memory chip provides its MOS-level output by way of an open collector MOS (or open drain MOSFET) transistor, to a second bi-polar chip, and thus presents an output having a variation in impedance rather than a variation in voltage level. The second bi-polar chip forms sense amp/bus driver circuitry, which circuitry senses the impedance level variation from the MOS memory chip, utilizing novel circuitry, and thus solves the above noted prior art problem. The impedance level variation associated with an open-drain MOSFET can typically be from 100 kilohms to 2 kilohms.

Other problems affecting sense amplifier or level converter operation, that have existed in the prior art include those derived from deleterious external effects on operation of the integrated circuit (IC) chip, e.g., external power supply variations. External effects were derived, in part, from the fact that the prior art sense amplifiers were not self-contained; off-chip, discrete components were used to generate reference and clamping levels. Therefore variations in the power supply including those variations that may have had a disproportionate impact, either on the integrated circuit or the discrete components, would create circuit operational problems. Variations in power supply level can create excessive delays, instabilities, and eventual malfunctions.

Additional delays can be created by not clamping or controlling switching voltage levels within specific limits. Clamping of voltages within specific tolerances can be accomplished by certain techniques that are suitable for implementation by bi-polar methods. One of these clamping techniques employs cascoded transistors to limit voltage swings, as for example those in a switching differential amplifier. In the prior art, this kind of cascoded collector-voltage variation-limit was of necessity fabricated from either multiple-chip bi-polar integrated circuits, or from hybrid discrete component/IC combinations. This swing-limit circuit was therefore accompanied by inherent drawbacks associated with either having discretes or with having more than one chip performing the amplification function. The present invention provides a solution to these other problems, as well.

The present invention employs a unique reference voltage generation and biasing scheme which makes the circuitry relatively insensitive to power supply variation, thereby obviating problems derived therefrom, and further permits construction of this reference voltage generation/biasing circuitry, and voltage swing limiting circuitry on a single chip, thereby obviating multiple chip and off-chip discrete component problems as well.

SUMMARY OF THE INVENTION

The present invention relates to a single integrated circuit semiconductor chip which forms at least one memory-sense amplifier. The amplifier receives a single input from main memory and provides an provides output amplified signal to the CPU over the memory bus. The sense amplifier circuitry establishes multiple reference levels that are identically influenced by any variation of power supply amplitude. Input clamp circuitry, biased by one of these reference levels, is responsive to a signal from memory for generating a clamped representation of that signal. Differential amplifier structure, biased by the other of the identical reference levels, receives and amplifies the clamped representation of the input signal. Circuitry for receiving a STROBE signal and for combining that signal with the amplified output from the differential amplifier is provided, in order to conduct a signal to the memory bus at the time of simultaneous occurrence of both the amplified memory signal and the STROBE signal.

In a further feature of the present invention, the differential amplifier structure includes two distinct differential amplifiers, the output of the first feeding the input of the second; the first differential amplifier includes cascode transistors for collector clamping, whereby the input to the second differential amplifier is controlled within a specified voltage or current range to minimize delay time inherently associated with switching circuitry.

It is thus advantageous to employ the present invention within a data processing system to minimize the number of chips required in the memory portion of such system and to thus reduce the time required to transfer information from the memory portion to the memory bus and to the CPU.

It is thus a general object of the present invention to provide an improved data processing system.

It is a further object of the present invention to provide an improved memory/CPU interface bus scheme, in which an improved sense amplifier and bus driver permits increased speed of operation and general improved operation and efficiency.

Other advantages and objects of the present invention will be apparent to those skilled in the art after referring to a detailed description of the appended drawings in which:

DESCRIPTION OF THE PREFERRED EMBODIMENTS

Figure 1:
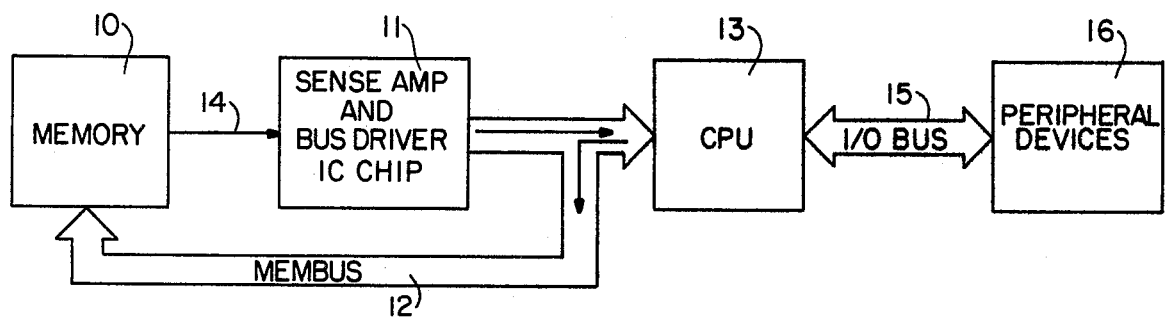
FIG. 1 is a functional block diagram of a data processing system in which the present invention is employed.

Referring to FIG. 1, it is seen that the data processing system including CPU 13 and main memory 10 is connected by way of MEMBUS 12 as well as being interfaced by level converter or sense amp and bus driver 11. (MEMBUS 12 is equivalent to bus 117 of FIG. 1 of incorporated-by-reference applications Ser. Nos. 662,117; 662,179; and 662,180. Input line 14 is equivalent to the output terminal of amplifier 16 of FIG. 4 of incorporated-by-reference application Ser. No. 665,478.) Signal inputs from memory 10, amplified by sense amp and bus driver 11 are provided to CPU 13 as indicated. (A MEMBUS transceiver, not shown, interfaces between MEMBUS 12 and CPU 13, and is not shown for purposes of improving the clarity of illustration of the present invention.) Information from CPU 13 is conducted back only to memory 10 as indicated. In the preferred embodiment, memory 10 is constructed from N-type MOS semiconductor material and sense amp and bus driver 11 is constructed from bi-polar technology. Peripheral devices 16 may be connected through from I/O BUS 15 from CPU 13 in order to provide useful input and output to the system.

Figure 2:
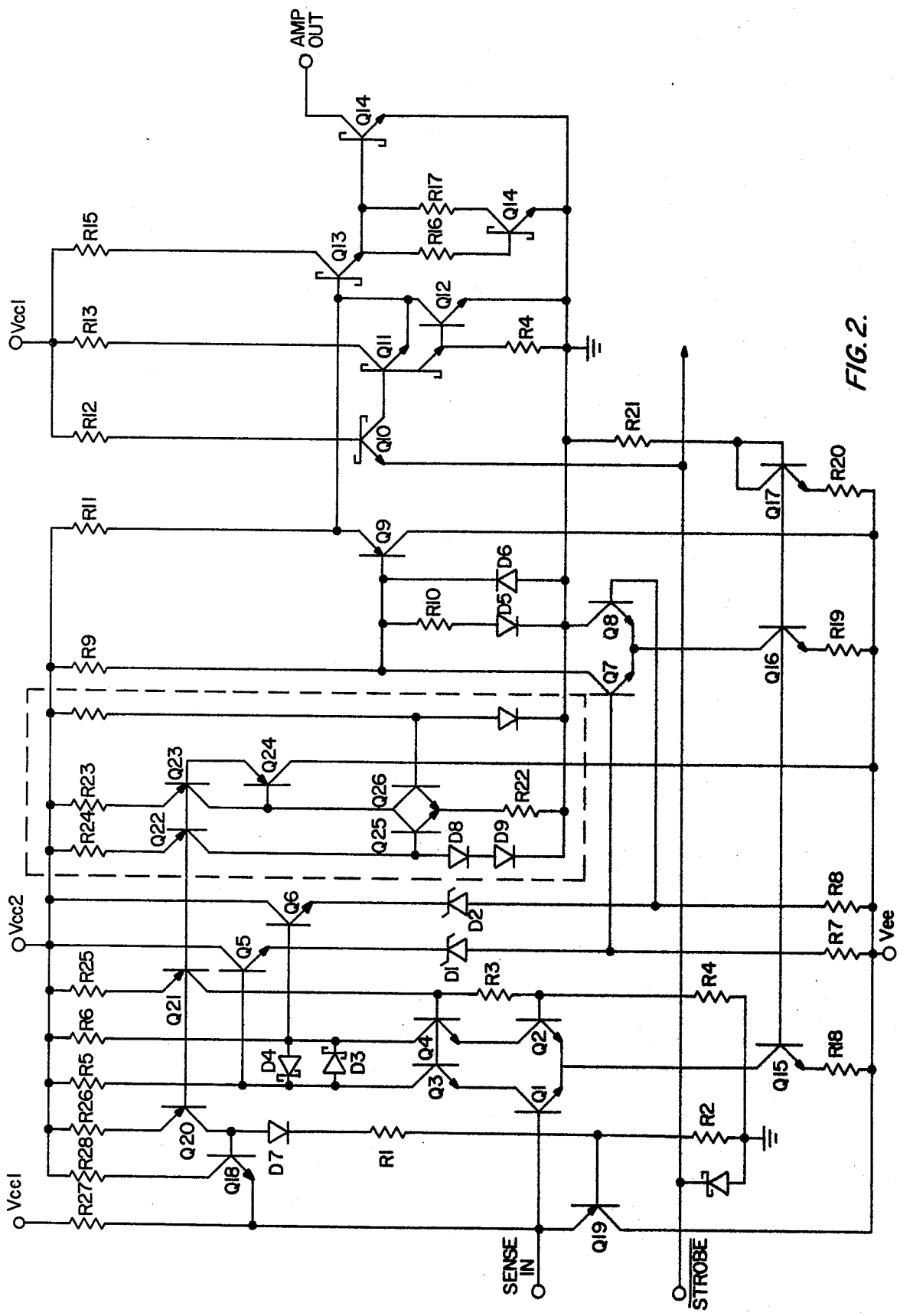
FIG. 2 is a schematic diagram of the circuitry of the present invention.

Referring next to FIG. 2, the detailed schematic circuitry of the bi-polar sense amplifier contained on a single chip is depicted. Input from the memory is received at "SENSE IN" terminal, and output to the bus which terminates in the CPU is provided by terminal "AMP OUT". The circuitry is connected between positive and negative power supplies, positive supplies being designated Vcc1 and Vcc2, and the negative supply designated Vee.

Prior to describing the detailed inter-connection of components, a brief functional layout of the circuitry is presented, by way of introduction. Transistors Q18 and Q19 at the input of the circuitry form lower and upper clamping devices for holding the input signal shifts to within a specific range. Transistors Q1 and Q2 in combination with transistor Q15 and their associated circuitry components form a first differential amplifier. Transistors Q7, Q8, and Q16 and their respective circuitry components form a second differential amplifier, receiving the output from the first differential amplifier. Transistors Q10, Q11, Q12, Q13, Q14' and Q14 form, in combination with other circuit components to which they are related, a nand gate and bus driver function. Finally, transistors Q22, Q23, Q24, Q25, Q26, Q21, and Q20 in combination with their respective circuit components form a constant current supply for establishing two reference voltages, one for biasing transistor Q2 and the other for setting up the specific input clamp voltage range.

Having thus described briefly the functioning of the circuitry, the circuit operation being described in more detail later, the detailed description of the circuit interconnection is now presented. Referring to the left-hand side of the circuitry, emitters of NPN transistor Q18 and PNP transistor Q19 are connected together and to the Sense In terminal, and to the base of Q1 of the first differential amplifier. Collector of transistor Q18 is connected to resistor R28, and therethrough to the positive power supply; the collector of transistor Q19 is connected through a resistor (not shown but inherently existing) to the negative power supply. These resistors are used primarily for current limitation purposes. The bases of transistors Q18 and Q19 are connected together through diode D7 and resistor R1, diode D7 and resistor R1 thus creating a voltage drop thereacross establishing a range within which the input signal may vary before being clamped by either Q18 or Q19. This operation will be discussed in more detail below. The base of transistor Q18 is connected to collector of PNP transistor Q20, the current source for this series circuit, the emitter of transistor Q20 being connected to resistor R26 and in turn to Vcc2. The base of transistor Q19 is connected between resistors R1 and R2, the other side of R2 being connected to ground.

Referring to transistor Q21, the other current source in this circuit for generating the other reference voltage, its emitter is connected to resistor R25, the other side of which is connected to Vcc2. The collector of this transistor is connected to the bases of transistors Q3 and Q4. These transistors are connected in cascode respectively with transistors Q1 and Q2, the reason for this connection to be discussed in more detail below. The bases of transistors Q3 and Q4 are connected to one side of biasing resistor R3, the other side being connected to the base of transistor Q2 and resistor R4, thus establishing the other reference voltage thereat; the other side of resistor R4 is connected to ground. Emitters of Q1 and Q2 being connected together as a differential amplifier are also connected to collector of transistor Q15 the emitter of which is connected to resistor Q18 and therethrough to the negative voltage supply. Zener diodes D3 and D4 interconnect collectors of transistors Q3 and Q4 as shown. And, output of the first differential amplifier is taken by way of bases of transistors Q5 and Q6, the emitters being connected to Zener diodes D1 and D2 respectively, and therethrough to bases of second differential amplifier transistors Q7, Q8 respectively.

Referring next to second differential amplifier transistors Q7 and Q8, their emitters are connected together and to the collector of the transistor Q16, the emitter of which is connected to resistor R19 and therethrough to Vee. The collector of transistor Q7 is connected to resistor R9, and therethrough to Vcc2. The collector of resistor Q8 is connected to ground. The base of transistor Q16 is connected to the base of transistor Q15 (and to the base of transistor Q17). These three transistors (Q15, Q16, and Q17) thus providing proper biasing or current sourcing for the two differential amplifiers.

Output from the second differential amplifier is taken by way of collector of transistor Q7 and conducted to the base of transistor Q9. The emitter of transistor Q9 is connected from the positive supply through resistor 11, the collector of transistor Q9 being connected to the negative supply. The output from transistor Q9 is conducted to the base of Q13, to the emitter of Q11, and to the collector of Q12. The STROBE input terminal is connected to the emitter of transistor Q10, the collector of which is connected to the base of transistor Q11. The base of Q10, connects to R12, to Vcc1; the collector of Q11 connects to R13, to Vcc1; and, the collector of Q13 connects to R15, to Vcc1. Thus, a nand gate is formed, where the STROBE signal is the gate signal, and more detail is presented in connection with FIG. 4 hereinbelow. The final output stage is derived from transistor Q13 and transistor Q14, the emitter of Q13 being connected to the base of transistor Q14.

The circuitry within the dashed line forms a constant current reference scheme. Power supply Vcc2 is connected by way of resistors R24 and R23 to the emitters of transistors Q22 and Q23 respectively. The bases of these transistors are connected together and to emitter of transistor Q24, (and outside the box to bases of Q21 and Q20, forming a reference level for these current sources). The collector of transistor Q22 is connected to both the base of transistor Q25 and to the anode side of diode D8. Diode D9 is connected from diode D8, and the cathode side of D9 is connected to ground. The collector of Q23 is connected to the base of Q24 and to both collectors of transistors Q25 and Q26, the emitters of which are also connected together and to one end of resistor R22 and other end being connected to ground. The base of transistor Q26 is connected between a resistor connected from Vcc2, and the diode connected to ground.

Figure 3:
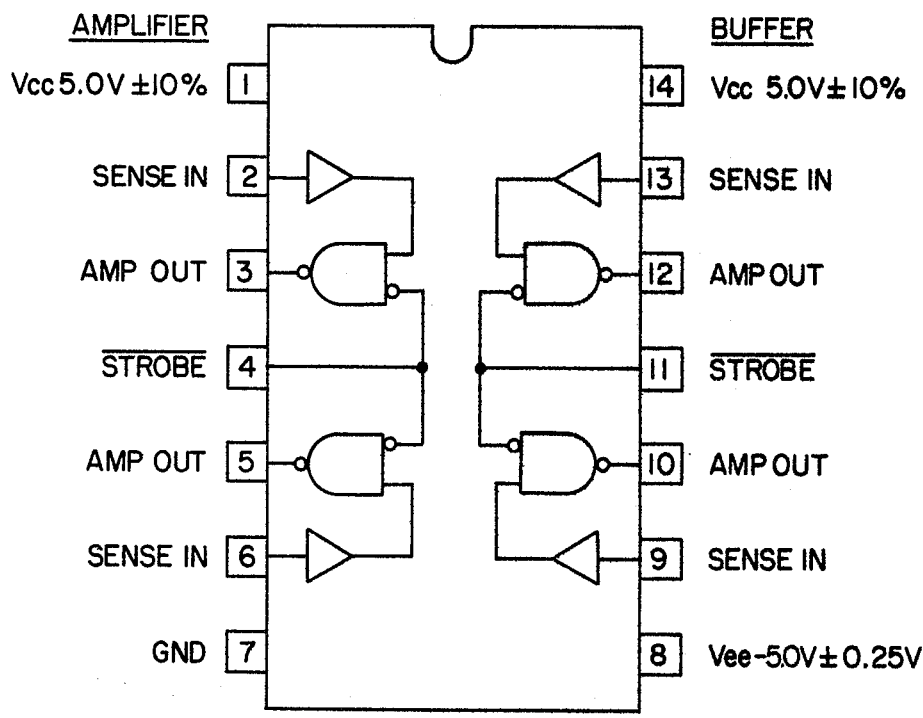
FIG. 3 is a diagram of the layout of four integrated circuit sense amplifiers and bus drivers of FIG. 2 as they would be arranged and supported in a particular pin configuration; and, FIG. 4 depicts relative time relationship of waveforms of input and output signals, and the STROBE signal.

Referring to FIG. 3, a typical 14 pin, four-amplifier, integrated circuit configuration is shown. The sense amplifier/nand gate function blocks are clearly depicted, with the $\overline{\text{STROBE}}$ signal being conducted to two nand gates simultaneously. (Alternatively, one $\overline{\text{STROBE}}$ signal could be conducted to all four nand gates simultaneously.)

Figure 4:
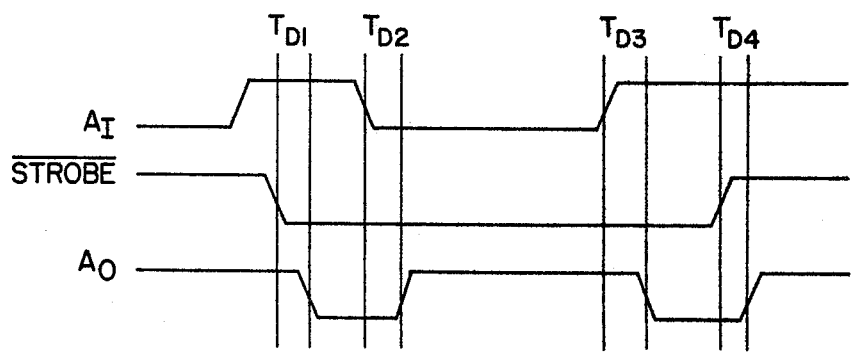

Referring to FIG. 4, input signal waveform AI, output signal waveform AO, and $\overline{\text{STROBE}}$ I pulse are shown. TD1 represents time delay from the leading edge of the $\overline{\text{STROBE}}$ 1 pulse to the leading edge of the output pulse AO and has been measured to be within 7 to 15 nanoseconds. TD2 represents time delay from the trailing edge of input pulse AI to trailing edge of output pulse AO and has been measured to be within 25 to 38 nanoseconds. These times are considerably less than those provided by prior art sense amplifiers with single chip, bi-polar, technology. Similarly, TD3 is measured to be within 10 to 22 nanoseconds, and TD4 is measured to be within 7 to 15 nanoseconds.

In operation, consider a pulse (e.g. AI) to be applied from an N channel MOS RAM memory with an open drain output to the Sense in terminal indicated in FIG. 2. The normal off impedance of an open drain output MOS transistor exceeds 100 kilohms; the normal on impedance is 2 kilohms.

Q2 is normally off and Q1 is normally conducting. However, prior to considering the switching effect of the differential amplifier Q1/Q2 it is important to note the operation of the clamping effect of clamping transistors Q18 and Q19. The TRUE input level clamp, transistor Q19, is made to conduct when a positive pulse is supplied through the MOS output impedance to the Sense In terminal, which tends to exceed by a voltage equal to an emitter-base voltage drop the reference established at the base of transistor Q19. Thus the Sense In terminal's positive going voltage, applied from the RAM's output drain MOS impedance, cannot exceed a particular TRUE level clamp established by that base reference voltage. By contrast, when there is low voltage input, from the N-channel MOS memory, transistor Q19 does not conduct, but transistor Q18 does. Transistor Q18 conducts whenever its emitter voltage tends to fall below its base reference voltage by an amount equal to a base emitter voltage drop. Thus the Sense In terminal is clamped to that voltage when low voltage would otherwise tend to appear at the Sense In terminal. Accordingly, the base of Q1 does not see a wider variation in voltage than that established by clamp transistors Q18, Q19, operating from the variation in base reference level therebetween in conjunction with the RAM output impedance.

It is important to note that the current sources generated by transistors Q20 and Q21 which form reference levels for both Q1 and Q2 of the first differential amplifier are identical current sources, constructed from matched transistor pairs, and which are identically or equally influenced by any variations in power supply. Thus the transistor clamp reference level range established across diode D7 and resistor R1, and the voltage bias on the base of transistor Q2 track each other and vary together, if they vary at all. This automatic offsetting between variations in the input clamp voltage range and the Q2 base reference level voltage of the first differential amplifier, makes operation of the first differential amplifier relatively insensitive to power supply variation. This relative insensitivity thus permits a collector voltage limiting cascode technique employing transistors Q3 and Q4 to be implemented. This limits voltage swing when the differential amplifier switches, which limitation and voltage swing thus reduces delay time of a signal passing through the circuitry. (As noted, in some prior art circuits, this cascoding technique might have been implemented, but only by employing multiple chips, since the unique biasing as presented herein was not employed in the prior art.)

Consider a positive going input signal. When a positive going signal is applied to the Sense Input, Q1 conducts and Q2 is off. The collector of transistor Q3 and the base of transistor Q5 will both be low with respect to the collector of transistor Q4, and the base of Q6. This differential voltage will be level shifted through the base-emitter junctions of transistors Q5 and Q6 and diodes D1 and D2, causing the base of transistors Q7 to be low with respect to the base of transistor Q8. This causes transistors Q7 to be off and transistor Q8 to be on. The off condition of transistor Q7 causes the collector of transistor Q7, base of transistor Q9, to be high. This high level signal is level shifted through the base emitter of Q9 to the base of transistor Q13 causing transistor Q13 to be turned on. Transistor Q13 on condition causes transistor Q14 to be on, thus causing the collector to be low. Thus a low condition is transmitted over the memory bus responsive to a high level input signal, and signal inversion thus takes place.

Considering the opposite input condition, when the input is low level, the collector of transistor Q3 and the base of transistor Q5 will be high with respect to the collector of transistor Q4 and base of transistor Q6. This differential voltage will then be similarly level shifted through the base emitter junctions of transistors Q5 and Q6, and through diodes D1 and D2, causing the base of transistor Q7 to be high respective to the base of transistor Q8. This causes transistor Q7 to be on, and transistor Q8 to be off. The conducting state of transistor Q7 causes the collector of transistor Q7, base of transistor Q9, to be low. And this low level signal is level shifted through transistor Q9, base emitter, to the base of transistor Q13 causing Q13 to be turned off. The off condition of transistor Q13 causes transistor Q14 to be off, allowing the collector of Q14 to rise. This produces a high level output of the sense amplifier/buffer, and the drive to the memory bus is high responsive to a low input level signal. Again, the signal inversion takes place.

Briefly recapitulating the inter-connection and operation descriptions, the sense input of this amplifier is single ended and clamped at both the True input level and False input level, to minimize voltage swing on this line, (since this line is normally a high capacitive line, minimizing voltage swing minimizes delay time caused thereby). The True input level clamp consists of transistor Q19, a PNP transistor, whose emitter is on the sense input line and whose base goes to a reference divider. Q19 is connected as an emitter follower transistor, whose collector is current-limited for short circuit protection. Collector of Q19 is connected to negative-bias power supply Vee, through an inherent resistance (not shown). False level input clamp consists of NPN transistor Q18 whose emitter is attached to the sense line, and whose base is attached to the same reference divider (but at a voltage reference range removed) as input transistor Q19. Transistor Q18 is an NPN emitter follower whose collector is current limited by resistor R28 for short circuit protection and whose collector is connected therethrough to a positive bias supply.

Reference divider for the input clamp network consists of resistors R1, R2 and diode D7. This divider is driven from constant current source Q20. The reference voltage divider for the base reference of transistor Q2 consists of resistors R3 and R4 which is controlled by constant current source Q21. Current sources Q21 and Q20 are matched current sources, thereby providing the tracking of the input clamp voltage range with the reference voltage of the input to the amplifier. This tracking characteristic makes the input threshold voltage relatively insensitive to power supply variation. The constant current source biasing circuitry is made up generally of transistors Q26 and Q26 diodes D8, D9, resistor R22 and PNP transistors Q22, Q23, and Q24. (Transistors Q22 and Q23 are also matched with Q20/Q21). The reference current for this current source biasing circuitry is established by approximately 1 diode voltage drop across resistor R22 which establishes a reference current in transistor Q23. The constant voltage drop across resistor R22 is maintained by biasing transistor Q25 through matched current source transistor Q22. This biasing scheme allows this current source to be relatively independent of positive power supply variations.

Transistors Q15 and Q16 comprise current source transistors for the differential amplifier stages. The biasing of these current sources is achieved through transistor Q17 and resistor-divider R21 and R20. These current sources allow the gain of the differential amplifiers to remain relatively constant over a variation of negative bias supply voltage.

This sense amplifier scheme is designed to be used with N-channel MOS memories which utilize an open drain output. The normal off impedance of an open drain output MOS transistor is typically in excess of 100 kilohms. This will allow the sense amplifier input to be controlled by the true level clamp which is established approximately 200 millivolts above the base reference voltage of transistor Q3 which will establish Q1 as the normally conducting transistor of the input differential amplifier. The normal on impedance of an MOS transistor is typically less than 2 kilohms. This impedance will cause the input to the sense amplifier to be controlled by the input False level clamp which is typically 200 millivolts below the base reference voltage of transistor Q2. This will cause the input differential amplifier to switch, allowing transistor Q1 to now be cut off and transistor Q2 to be the conducting transistor of the input differential amplifier. This switching of the input differential amplifier is cascoded-collector swing-limited and is coupled through two levels of gain to the output bus driver. When the output bus driver is enabled through Q10 by a false STROBE (or $\overline{\text{STROBE}}$) signal, an "off" memory state will produce a saturated condition of transistor Q14 and an "on" memory state will represent an "off" condition of Q14.

In the preferred embodiment of the present invention, the resistors have the following approximate values (in ohms):

| R1 | 370 | R11 | 3K | R21 | 1.48K |
| R2 | 2.44K | R12 | 2.8K | R22 | 880 |
| R3 | 1.2K | R13 | 2K | R23 | 300 |
| R4 | 3.4K | R14 | 1.2K | R24 | 300 |
| R5 | 540 | R15 | 670 | R25 | 300 |
| R6 | 540 | R16 | 250 | R26 | 300 |
| R7 | 2.5K | R17 | 100 | R27 | 2.3K |
| R8 | 2.5K | R18 | 200 | R28 | 280 |
| R9 | 2K | R19 | 125 | | |
| R10 | 170 | R20 | 200 | | |

The invention may be embodied in yet other specific forms without departing from the spirit or essential characteristics thereof. Thus, the present embodiments are to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. In a data processing system including a CPU for processing said data and a main memory connected from said CPU by a memory bus for storing at least said data, an integrated circuit semiconductor chip energized by a power supply and forming a sense amplifier for receiving a signal input from said memory and for providing an amplified signal output to said CPU via said bus, said sense amplifier comprising:
    constant current means for establishing reference levels which are identically influenced by variation of said power supply;
    input clamp means biased by one of said reference levels and responsive to said signal input for generating a clamped representation of said signal input;
    differential amplifier means biased by the other of said reference levels for receiving said clamped representation of said signal input and for providing intermediate amplification thereof;
    means for receiving a STROBE signal; and,
    gate means for combining said amplified representation of said signal input with said STROBE signal, and for providing said amplifier signal output at the time of simultaneous occurrence of both said amplified representation of said signal input and said STROBE signal.

2. The sense amplifier recited in claim 1 and wherein said constant current means includes:
    means for establishing a constant current source biasing voltage; and,
    a matched transistor pair connected from said supply and biased by said voltage for generating substantially equal constant currents.

3. The sense amplifier recited in claim 2 and wherein said differential amplifier means comprises two differential amplifiers, the output of the first of said differential amplifiers providing the input to the second of said differential amplifiers, said first differential amplifier including cascode transistor means for collector clamping to control said input to said second differential amplifier within a specified range.

4. The sense amplifier of claim 3 and wherein said gate means includes means for driving said bus with said amplified signal.

5. The sense amplifier of claim 4 and wherein said memory is constructed from MOS integrated circuits and said amplifier is a bi-polar integrated circuit.

* * * * *